(12) United States Patent
Kim et al.

(10) Patent No.: US 9,633,939 B2
(45) Date of Patent: Apr. 25, 2017

(54) SEMICONDUCTOR PACKAGE AND MANUFACTURING METHOD THEREOF

(71) Applicant: Amkor Technology, Inc., Tempe, AZ (US)

(72) Inventors: Do Hyung Kim, Seongnam-si (KR); Dae Joon Park, Seoul (KR); See Won Kim, Uijeongbu-si (KR); Jung Soo Park, Seongnam-si (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/049,872

(22) Filed: Feb. 22, 2016

(65) Prior Publication Data

US 2016/0247767 A1  Aug. 25, 2016

(30) Foreign Application Priority Data

Feb. 23, 2015 (KR) .......................... 10-2015-0024957

(51) Int. Cl.
| | |
|---|---|
| *H01L 23/48* | (2006.01) |
| *H01L 23/498* | (2006.01) |
| *H01L 23/31* | (2006.01) |
| *H01L 21/56* | (2006.01) |

(52) U.S. Cl.
CPC .... *H01L 23/49838* (2013.01); *H01L 23/3128* (2013.01); *H01L 23/49811* (2013.01); *H01L 21/561* (2013.01); *H01L 2224/16225* (2013.01); *H01L 2224/73204* (2013.01); *H01L 2924/15311* (2013.01); *H01L 2924/181* (2013.01)

(58) Field of Classification Search
CPC ........... H01L 23/49838; H01L 23/3128; H01L 23/49811
USPC ........................................................ 257/737
See application file for complete search history.

(56) References Cited

U.S. PATENT DOCUMENTS

2015/0145142 A1* 5/2015 Lin .................... H01L 25/50
257/774

\* cited by examiner

*Primary Examiner* — Anthony Ho
(74) *Attorney, Agent, or Firm* — McAndrews, Held & Malloy, Ltd.

(57) ABSTRACT

A semiconductor package and a method of manufacturing a semiconductor package. As non-limiting examples, various aspects of this disclosure provide various semiconductor packages, and methods of making thereof, that comprise a cover layer that enhances reliability of the semiconductor packages.

20 Claims, 10 Drawing Sheets

SEMICONDUCTOR PACKAGE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2015-0024957, filed on Feb. 23, 2015 in the Korean Intellectual Property Office and titled "METHOD FOR FABRICATING SEMICONDUCTOR PACKAGE AND SEMICONDUCTOR PACKAGE USING THE SAME," the contents of which are hereby incorporated herein by reference in their entirety.

The present application is related to U.S. patent application Ser. No. 14/823,689, filed Aug. 11, 2015, and titled "SEMICONDUCTOR PACKAGE AND FABRICATING METHOD THEREOF," the entire contents of which are hereby incorporated herein by reference.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Various aspects of this disclosure provide a semiconductor package and a method of making a semiconductor package. As non-limiting examples, various aspects of this disclosure provide various semiconductor packages, and methods of making thereof, that comprise a cover layer that enhances reliability of the semiconductor packages.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Various aspects of the present disclosure provide a semiconductor device or package and a manufacturing method thereof, which can decrease the cost, increase the reliability, and/or increase the manufacturability of the semiconductor device.

Various aspects of the present disclosure also provide a semiconductor device or package and a manufacturing method thereof, which prevent or inhibit conductive ions of a conductive post from being diffused into a semiconductor die.

Various aspects of the present disclosure additionally provide a semiconductor device or package and a manufacturing method thereof, which prevent or inhibit warping or twisting from occurring during manufacturing and/or after manufacturing.

Various aspects of the present disclosure provide a method of manufacturing a semiconductor package, the method comprising forming an interposer (or redistribution structure) on a wafer, forming at least one conductive pad and at least one conductive post on the interposer, disposing at least one semiconductor die on the interposer and electrically connected to the conductive pad, forming a cover layer on various surfaces of the semiconductor die, the post, and/or the interposer, encapsulating the post and the semiconductor die on the interposer using an encapsulant, and exposing the post to the outside of the cover layer and the encapsulant.

Various aspects of the present disclosure also provide a semiconductor package comprising an interposer, at least one conductive pad and at least one conductive post on the interposer, at least one semiconductor die disposed on the interposer and electrically connected to the conductive pad, a cover layer on various surfaces of the semiconductor die, the post, and/or the interposer, and an encapsulant encapsulating the post and the semiconductor die on the interposer, wherein one end of the post is exposed to the outside of the cover layer and the encapsulant.

The above and other aspects of the present disclosure will be described in or be apparent from the following description of various example implementations. Various aspects of the present disclosure will now be presented with reference to accompanying drawings, such that those skilled in the art may readily practice the various aspects.

Figure 1:
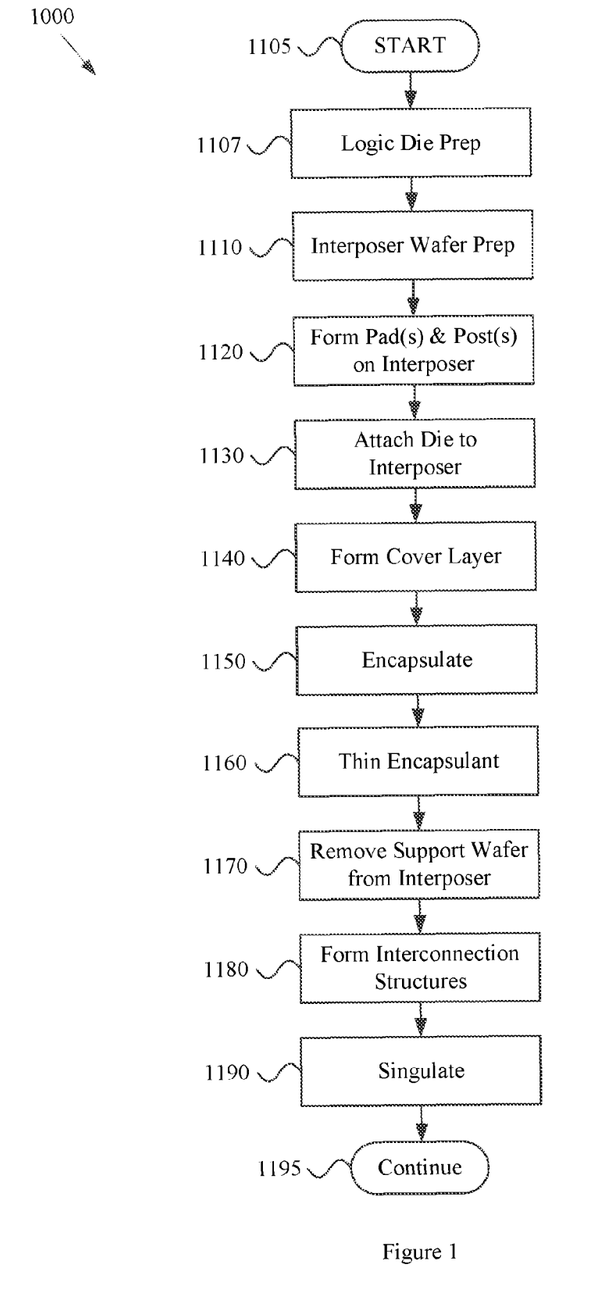
FIG. 1 shows a flow diagram of an example method of making a semiconductor package, in accordance with various aspects of the present disclosure.

FIG. 1 shows a flow diagram of an example method 1000 of making a semiconductor package. The example method 1000 may, for example, share any or all characteristics with any other method discussed herein (e.g., the example method 3000 of FIG. 3, etc.). FIGS. 2A-2I show cross-sectional views illustrating an example semiconductor package and an example method of making a semiconductor package, in accordance with various aspects of the present disclosure. The structures shown in 2A-2I may share any or all characteristics with analogous structures shown in FIGS. 4A-4H. FIGS. 2A-2I may, for example, illustrate an example semiconductor package at various stages (or blocks) of the example method 1000 of FIG. 1. FIGS. 1 and 2A-2I will now be discussed together. It should be noted that the order of the example blocks of the example method 1000 may vary without departing from the scope of this disclosure.

The example method 1000 may, at block 1107, comprise preparing a logic wafer for processing (e.g., for packaging). Block 1107 may comprise preparing a logic wafer for processing in any of a variety of manners, non-limiting manner of which are provided herein.

For example, block 1107 may comprise receiving a logic wafer, for example from supplier shipping, from an upstream process or station at a manufacturing site, etc. The logic wafer may, for example, comprise a semiconductor wafer that comprises a plurality of active semiconductor die. The semiconductor die may, for example, comprise a processor die, memory die, programmable logic die, application specific integrated circuit die, general logic die, etc.

Block 1107 may, for example, comprise forming conductive interconnection structures on the logic wafer. Such conductive interconnection structures may, for example, comprise conductive pads, lands, bumps or balls, conductive posts or pillars, etc. The forming may, for example, comprise attaching preformed interconnection structures to the logic wafer, plating the interconnection structures on the logic wafer, etc.

In an example implementation, the conductive structures may comprise conductive posts or pillars comprising copper and/or nickel, and may comprise a solder cap (e.g., comprising tin and/or silver). For example, conductive structures comprising conductive pillars may comprise: (a) an under bump metallization ("UBM") structure that includes (i) a layer of titanium-tungsten (TiW) formed by sputtering (which may be referred to as a "seed layer"), and (ii) a layer of copper (Cu) on the titanium-tungsten layer formed by sputtering, (b) a copper post or pillar formed on the UBM by electroplating, and (c) a layer of solder formed on the copper pillar or a layer of nickel formed on the copper pillar with a layer of solder formed on the nickel layer.

Also, in an example implementation, the conductive structures may comprise a lead and/or lead-free wafer bump (e.g., Pb/Sn, leadless Sn, equivalents thereof, alloys thereof, etc.). For example, lead-free wafer bumps (or interconnect structures) may be formed, at least in part, by: (a) forming an under bump metallization (UBM) structure by (i) forming a layer of titanium (Ti) or titanium-tungsten (TiW) by sputtering, (ii) forming a layer of copper (Cu) on the titanium or titanium-tungsten layer by sputtering, (iii) and forming a layer of nickel (Ni) on the copper layer by electroplating; and (b) forming a lead free solder material on the nickel layer of the UBM structure by electroplating, wherein the lead free solder material has a composition by weight of 1% to 4% silver (Ag) and the remainder of the composition by weight is tin (Sn).

Block 1107 may, for example, comprise performing partial or full thinning of the logic wafer (e.g., grinding, etching, etc.). Block 1107 may also, for example, comprise dicing the logic wafer into separate die or die sets for later attachment (e.g., at block 1130).

In general, block 1107 may comprise preparing a logic wafer for processing (e.g., for packaging). Accordingly, the scope of this disclosure should not be limited by characteristics of particular type of logic wafer and/or die, or any particular type of logic wafer and/or die processing.

The example method 1000 may, at block 1110, comprise preparing an interposer wafer (or panel). In an example implementation, an interposer (e.g., a bottom surface thereof) may be attached to a surface of a support wafer (e.g., a top surface thereof). Such attachment may, for example, be perform utilizing an adhesion member (not shown) (e.g., a thermal release adhesive, etc.), mechanical attachment, vacuum attachment, etc. Note that the support wafer may comprise a semiconductor (e.g., silicon, etc.) wafer, a glass wafer, a metal wafer, etc. Also note that the support wafer need not be circular, but may also comprise a rectangular (or panel) shape.

Figure 2A:
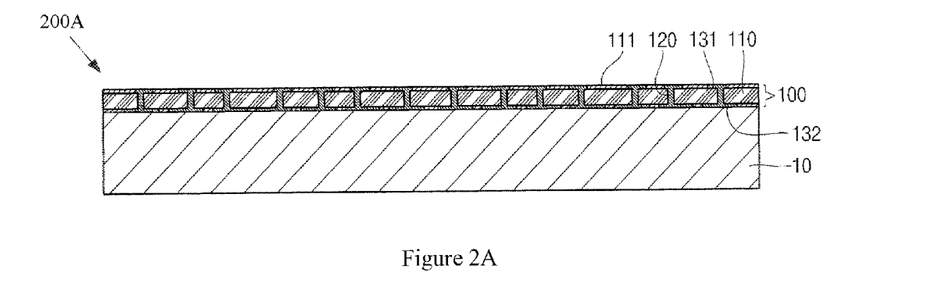
FIGS. 2A-2I show cross-sectional views illustrating an example semiconductor package and an example method of making a semiconductor package, in accordance with various aspects of the present disclosure.

The interposer 100 may, for example, be (or have been) formed utilizing a semiconductor wafer fabrication (FAB) process. Such processing may, for example, be utilized to produce fine-pitch pads and/or traces, for example with a trace width and/or pitch (e.g., center-to-center spacing) of 10 microns or less.

An example implementation 200A is shown at FIG. 2A, which shows the interposer 100 comprising a dielectric layer 111 (which may also be referred to herein as a protection layer) is formed on each of top (or upper) and bottom (or lower) surfaces of a silicon body 110. The dielectric layer 111 may, for example, comprise one or more layers of any of a variety of dielectric materials, for example inorganic dielectric material (e.g., $Si_3N_4$, $SiO_2$, SiON, oxides, nitrides, etc.) and/or organic dielectric material (e.g., polyimide (PI), benzocyclobutene (BCB), polybenzoxazole (PBO), bismaleimide triazine (BT), a phenolic resin, epoxy, etc.), but the scope of the present disclosure is not limited thereto. The dielectric layer 111 may be formed using any one or more of a variety of processes (e.g., spin coating, spray coating, printing, sintering, thermal oxidation, physical vapor deposition (PVD), chemical vapor deposition (CVD), plasma vapor deposition, sheet lamination, etc.), but the scope of the present disclosure is not limited thereto.

In addition, a plurality of through silicon vias (TSVs) 120 are formed in the silicon body 110. Further, an upper circuit pattern 131 (or conductive layer) electrically connected to the TSVs 120 and exposed to the outside of the dielectric layer 111 (e.g., through apertures formed therein) is formed on an upper side of the silicon body 110, and a lower circuit pattern 132 (or conductive layer) electrically connected to the TSVs 120 and exposed to the outside of the dielectric layer 111 (e.g., through apertures formed therein) is formed on a lower side of the silicon body 110. The TSVs 120 may, for example, provide conductive pathways between the upper circuit pattern 131 and the lower circuit pattern 132. Note that the interposer 100 may also comprise one or more internal conductive layers. Any of the conductive layers may, for example, provide for the distribution of electrical signals vertically and/or horizontally with respect to the interposer 100.

In an example scenario, the interposer 100 (or redistribution structure) may be formed separate from the support wafer 10 and then attached thereto. In another example scenario, the interposer 100 may be formed (or built) directly on a wafer, in which case the interposer 100 (or redistribution structure) is already attached to the support wafer 10 and need not be further adhered or otherwise attached to the support wafer 10. Various examples of such an interposer (or redistribution structure) and/or the forming thereof are provided in U.S. patent application Ser. No. 14/823,689, filed Aug. 11, 2015, and titled "SEMICONDUCTOR PACKAGE AND FABRICATING METHOD THEREOF," the entire contents of which are hereby incorporated herein by reference. For example, an interposer (or redistribution structure) may be formed by forming one or more dielectric and conductive layers on a silicon wafer. In such an example, the interposer 100 might not comprise a silicon body (or core).

Note that block 1110 may comprise receiving the interposer wafer from an adjacent or upstream manufacturing station at a manufacturing facility, from another geographical location, etc. The interposer wafer may, for example, be received already prepared or additional preparation may be performed In general, block 1110 may comprise preparing an interposer wafer. Accordingly, the scope of this disclosure should not be limited by characteristics of any particular type of interposer or interposer wafer, or by any particular manner of forming such an interposer or interposer wafer.

The example method 1000 may, at block 1120, comprise forming one or more conductive pads and/or conductive posts (or pillars) on the interposer. Block 1120 may comprise forming such conductive pads and or posts in any of a variety of manners, non-limiting examples of which are provided herein. For example, the conductive pads and/or posts may be formed by sputtering or other physical vapor deposition (PVD) technique, chemical vapor deposition (CVD), general vacuum deposition, electroplating, electroless plating, etc.

In an example implementation, block 1120 may comprise plating the conductive pads and/or conductive posts on traces of the upper circuit pattern 131 that are exposed from the dielectric layer 111. To perform such plating, block 1120 may for example comprise forming a seed layer on the upper side of the interposer 100. The seed layer may comprise any of a variety of materials. For example, the seed layer may comprise copper. Also for example, the seed layer may comprise one or more layers of any of a variety of metals (e.g., copper, silver, gold, aluminum, tungsten, titanium, nickel, molybdenum, etc.). The seed layer may be formed utilizing any of a variety of techniques (e.g., sputtering or other physical vapor deposition (PVD) technique, chemical vapor deposition (CVD), electroless plating, etc.).

Block 1120 may then, for example, comprise forming a template (e.g., utilizing a photoresist, any of a variety of dielectric materials, photolithography in general, etc.) on the seed layer to expose a portion of the seed layer on which the conductive pads and/or posts are to be plated. Block 1120 may then, for example, comprise electroplating the conductive pads and/or posts and removing (or stripping) the template. Such template forming and plating may, for example, be performed multiple times. For example, the conductive posts or a portion thereof may be formed in a plating process separate from a plating process that forms the conductive pads.

The conductive pads and/or posts may comprise any of a variety of characteristics. The conductive pads and/or posts may, for example, comprise plated copper. Also for example, the conductive pads and/or posts may comprise one or more layers of any of a variety of materials (e.g., copper, aluminum, nickel, iron, silver, gold, titanium, chromium, tungsten, combinations thereof, alloys thereof, etc.), but the scope of the present disclosure are not limited thereto.

Figure 2B:
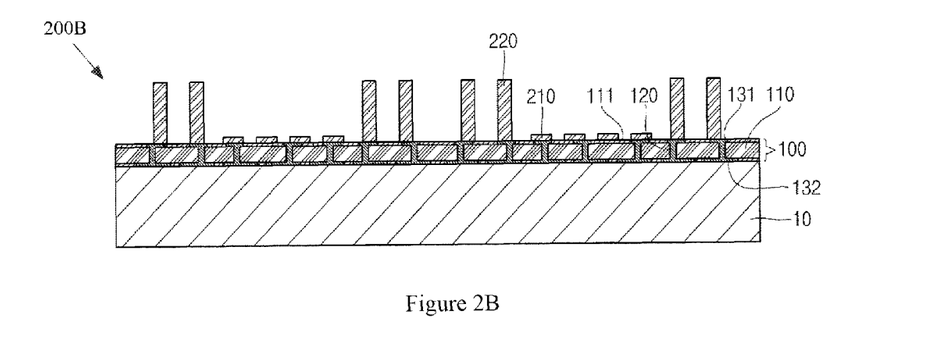

An example 200B is shown at FIG. 2B. A conductive pad 210 and a conductive post 220, each electrically connected to the upper circuit pattern 131 of the interposer 100, are formed on the upper surface of the silicon body 110. As provided herein, the conductive pad 210 may be electrically connected to a semiconductor die and the post 220 may be connected to another electrical device (e.g., another semiconductor package, a substrate, a motherboard, etc.). The conductive pad 210 may, for example, be generally flat. The conductive post 220 may, for example, be generally shaped like a pillar standing in a direction substantially perpendicular to the silicon body 110. As discussed herein, the conductive post 220 may be substantially taller than the conductive pad 210. For example, the conductive post 220 may have a longitudinal length at least as high as the combined thickness of the conductive pad 210, the conductive interconnection structures between the conductive pad 210 and a semiconductor die, and the semiconductor die.

Block 1120 may generally comprise forming one or more conductive pads and/or conductive posts on the interposer. Accordingly, the scope of this disclosure should not be limited by characteristics of any particular type of conductive pad or post or by any particular manner of forming a conductive pad or post.

The example method 100 may, at block 1130, comprise attaching one or more semiconductor die to the interposer (or redistribution (RD) structure). Block 1130 may comprise attaching the one or more semiconductor die to the interposer in any of a variety of manners, non-limiting examples of which are provided herein.

The semiconductor die may comprise characteristics of any of a variety of types of semiconductor die. For example, the semiconductor die may comprise a processor die, a memory die, an application specific integrated circuit die, a general logic die, an active semiconductor component in general, etc.). Note that passive components may also be attached at block 1130.

Block 1130 may comprise attaching the semiconductor die (e.g., as prepared at block 1107) in any of a variety of manners, non-limiting examples of which are provided herein. For example, block 1130 may comprise attaching the semiconductor die utilizing mass reflow, thermocompression bonding (TCB), conductive epoxy, etc.

Figure 2C:
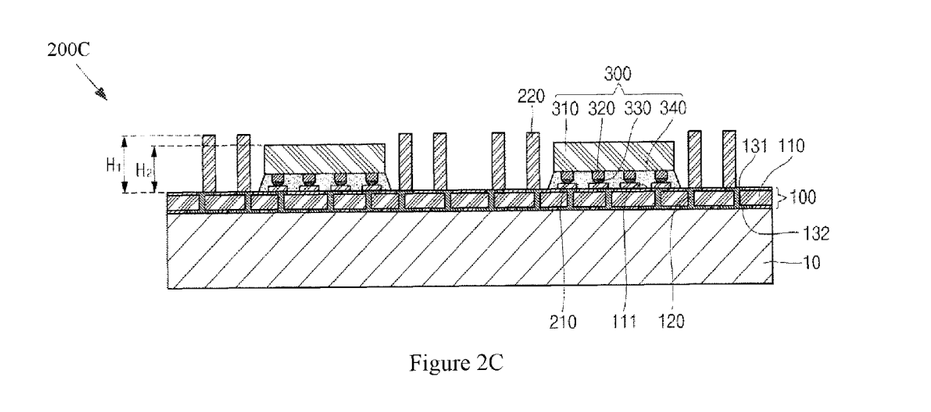

FIG. 2C provides an example illustration 200C of various aspects of block 1130, for example die attachment aspects. For example, the semiconductor die 310 (e.g., which may have been diced from a logic wafer prepared at block 1107)

is electrically and mechanically attached to the interposer 100. Similarly, other die (e.g., which may have been diced from a logic wafer prepared at block 1107) may be electrically and mechanically attached to the interposer 100. For example, as explained at block 1107, the logic wafer (or die thereof) may have been prepared with various interconnection structures (e.g., conductive pads, lands, bumps, balls, wafer bumps, conductive pillars, etc.) formed thereon (e.g., on an active side thereof, etc.). Examples of such structures are shown generally in FIG. 2C as the bond pad 320 on the bottom (e.g., active) side of the die 310 and the solder bump 330. The solder bump 330 may, for example, mechanically and electrically couple the bond pad 320 and the conductive pad 210 to each other (e.g., through a reflow process). Block 1130 may, for example, comprise electrically and mechanically attaching such interconnection structures to the interposer 100 (e.g., a conductive pad 210 thereon) utilizing any of a variety of attachment processes (e.g., mass reflow, thermocompression bonding (TCB), conductive epoxy, etc.).

In the example implementation 200C shown in FIG. 2C, a height H1 of the upper end of the post 220 above the interposer 100 is greater than a height H2 of the upper side of the semiconductor die 310 above the interposer 100. Such a height differential may, for example, prevent a cover layer formed on the semiconductor die 310 from being removed during an encapsulant thinning (or conductive post revealing) process to be described later. In an example implementation, H1 is greater than H2 by a thickness of a cover layer (e.g., as formed at block 1140). In an example implementation, H1 is greater than H2 by more than a thickness of a cover layer (e.g., as formed at block 1140), which may for example leave at least a portion of mold material or other dielectric material on an upper side of the semiconductor die 310 after encapsulating (e.g., at block 1150) and thinning (e.g., at block 1160).

Though the example implementation 200C at FIG. 2C is generally shown with a single die per package area of the interposer 100 (e.g., as will be singulated into a single package at block 1190), it should be understood that any number of die and/or passive components may be included per package area. For example, each package area may comprise two die, three die, four die, or more than four die.

Block 1130 may also comprise underfilling the semiconductor die and/or other components attached to the interposer. Block 1130 may comprise performing such underfilling in any of a variety of manners, non-limiting examples of which are provided herein.

For example, after die attachment, block 1130 may comprise underfilling the semiconductor die utilizing a capillary underfill. For example, the underfill may comprise a reinforced polymer material viscous enough to flow between the attached semiconductor die and the interposer in a capillary action. Also for example, block 1130 may comprise underfilling the semiconductor die utilizing a non-conductive paste (NCP) and/or a non-conductive film (NCF) or tape while the die are being attached at block 1130 (e.g., utilizing a thermocompression bonding process). For example, such underfill materials may be deposited (e.g., printed, sprayed, etc.) prior to attaching the semiconductor die (e.g., as a pre-applied underfill). The underfill may comprise any of a variety of types of material, for example, an epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxing underfill, and equivalents thereof, but not limited thereto.

As with all of the blocks illustrated in the example method 100, block 1130 may be performed at any location in the method 1000 flow so long as the space between the die and the interposer is accessible. The underfilling may also occur at a different block of the example method 1000. For example, the underfilling may be performed as part of the encapsulating (or wafer molding) block 1150 (e.g., utilizing a molded underfill).

FIG. 2C also provides an example illustration of various other aspects of block 1130, for example the underfilling aspects. The underfill 340 is positioned between the semiconductor die 310 and the interposer 100, for example surrounding lateral surfaces of the bond pads 320, solder bumps 330, and conductive pads 210, and covering the lower surface of the semiconductor die 310. Note that the semiconductor die 310, bond pad 320, solder bump 330, and underfill 340 may be referred to herein as a semiconductor module 300.

Though the underfill 340 is generally illustrated to be confined to the region beneath the die 310 and not covering any of the lateral sides of the semiconductor die 310, the underfill 340 may rise up and form fillets on the sides of the semiconductor die 310 and/or other components. In an example scenario, at least a fourth or at least a half of the die lateral side surfaces may be covered by the underfill material 340. In another example scenario, one or more or all of the entire lateral side surfaces of the die 310 may be covered by the underfill material 340. Also for example, a substantial portion of the space directly between the semiconductor die 310 and other components (not shown), and/or between other components (not shown) may be filled with the underfill material. For example, at least half of the space or all of the space between laterally adjacent semiconductor die, between the die and other components, and/or between other components may be filled with the underfill material. In an example implementation, the underfill 340 may cover an entire portion of the interposer 100 between the semiconductor die 310 and an adjacent conductive post 220. In another example implementation, the underfill 340 may cover the entire interposer 100. In such example implementation, when the interposer 100 is later singulated (e.g., at block 1190), such dicing may also cut through the underfill 340.

After underfilling the semiconductor die 310, the underfill 340 may then be cured. The underfill 340 may, for example, protect a bump bonds and/or other bonds from external impacts, such as mechanical shocks or corrosion, which may occur during or after a semiconductor package fabricating process.

In general, block 1130 may comprise attaching one or more semiconductor die to the interposer (or RD structure). Accordingly, the scope of this disclosure should not be limited by characteristics of any particular die, or by characteristics of any particular multi-die layout, or by characteristics of any particular manner of attaching such die, etc. Also, the scope of this disclosure should not be limited by characteristics of any particular type of underfill or of any particular manner of forming such underfill.

The example method 100 may, at block 1140, comprise forming a cover layer on the interposer 100, conductive post 220, and/or semiconductor module 300 (or portions thereof).

The cover layer may comprise any of a variety of materials. For example, the cover layer may comprise one or more layers of any of a variety of dielectric materials, for example inorganic dielectric material (e.g., SiN, $Si_3N_4$, $SiO_2$, SiON, oxides, nitrides, etc.) and/or organic dielectric material (e.g., a polymer, polyimide (PI), benzocyclobutene (BCB), polybenzoxazole (PBO), bismaleimide triazine (BT), a phenolic resin, an epoxy, etc.), but the scope of the present disclosure is not limited thereto. Note that in an implementation in which the cover layer comprises a plurality of layers, such layers may comprise dissimilar materials and/or may be performed utilizing different respective processes.

The cover layer may be formed (e.g., in a chamber, or other device) using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, etc.), but the scope of the present disclosure is not limited thereto.

Figure 2D:
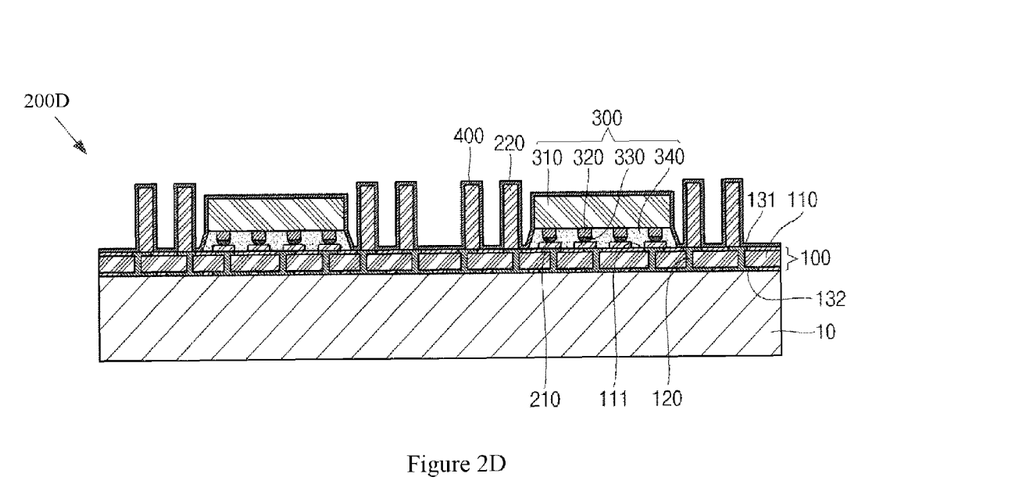

The cover layer may, for example, comprise a uniform (or constant) thickness. For example, the cover layer may comprise a continuous layer over and around any or all of the covered components. For example, the cover layer 400 may comprise a single continuous layer. In an example implementation, the cover layer 400 has an average thickness, and the thickness of the cover layer 400 does not vary from the average thickness by more than 25% (or by more than 10%). In an example implementation (e.g., utilizing particular deposition processes), the thickness of the cover layer 400 does not vary from the average thickness by more than 2%.

The cover layer 400 may, for example, be less than 1 micron thick, for example in the range of 0.1 to 1 microns. Also for example, the cover layer 400 may be less than 10 microns thick, for example in the range of 1 to 10 microns.

FIG. 2D provides an example illustration 200D of various aspects of block 1140, for example cover layer forming aspects. The example cover layer 400 is formed on all components of the illustrated assembly 200D that are exposed when the cover layer 400 is formed. For example, the cover layer 400 covers the exposed upper surface of the interposer 100 (e.g., all of the upper side of the interposer 100 that is not covered by conductive pads 210, conductive pillars 220, underfill 340, etc.). Also for example, the cover layer 400 covers the upper ends and lateral sides of the conductive posts 220. Additionally for example, the cover layer 400 covers the lateral sides and upper side of the semiconductor die 310. Further for example, the cover layer 400 covers the exposed part (e.g., lateral sides) of the underfill 340.

The cover layer 400 is generally continuous, for example extending continuously along an upper surface of the interposer 100 between any or all of the components of the assembly 200D (e.g., between adjacent conductive pillars 220, between the semiconductor die 310 (or underfill 340) and conductive pillars 220 adjacent thereto, etc. In an example implementation, the cover layer 400 is formed over an entire of wafer of package assemblies. As shown herein, after singulation (e.g., at block 1190) a lateral side surface of the cover layer 400 will be exposed at a lateral side of each singulated semiconductor package. Thus, the cover layer 400 may also extend continuously from any of the components of the illustrated assembly 200D to lateral sides of the singulated package.

Note that the cover layer 400 may directly contact any or all of the components of the assembly 200D on which the cover layer 400 is formed. There may also, however, be one or more intervening materials.

The cover layer 400 may, for example, operate to inhibit conductive ions of a conductive post 220 from migrating to and/or being diffused in the semiconductor die 310. The cover layer 400 may also, for example, provide for structural support (e.g., preventing or inhibiting warpage or twisting of the semiconductor package during and/or after production).

In general, block 1140 may comprise forming a cover layer on the interposer 100, conductive post 220, and/or semiconductor module 300 (or portions thereof). Accordingly, the scope of this disclosure should not be limited by characteristics of any particular cover layer and/or manner of forming thereof.

The example method 100 may, at block 1150, comprise encapsulating the assembly (or wafer or support structure). Block 1150 may, for example, comprise forming any of a variety of encapsulating materials (e.g., resin, polymer, polymer composite material (such as epoxy resin with filler, epoxy acrylate with filler, or polymer with a proper filler), etc.). Block 1150 may comprise performing such encapsulating in any of a variety of manners (e.g., compression molding, transfer molding, liquid encapsulant molding, vacuum lamination, paste printing, film assisted molding, etc.).

For example, block 1150 may comprise molding the interposer 100 at the wafer level. For example, block 1150 may comprise molding over the upper side of the interposer 100 wafer, over the die and/or other components attached at block 1130, over the pad(s), posts(s) or other interconnection structures formed at block 1120, over the underfill formed at block 1130, over the cover layer formed at block 1140, etc. In general, block 1150 may comprise molding over the upper surfaces and/or portions of the any of such components that are exposed when the molding (or encapsulating) process is performed.

Figure 2E:
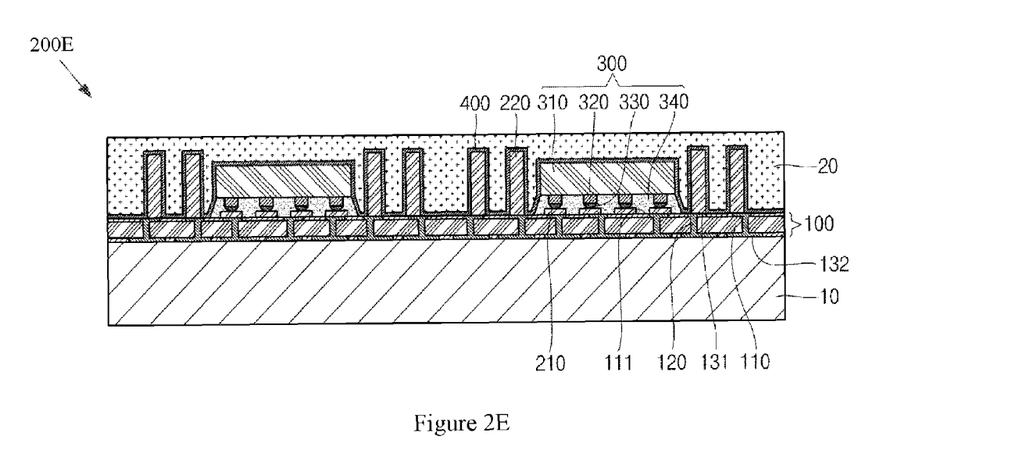

FIG. 2E provides an example illustration 200E of various aspects of block 1150, for example molding aspects. For example, the molded assembly 200E is shown with the mold material 20 covering the conductive post 220, semiconductor die 310, underfill 340, and the upper surface of the interposer 100. For example, the mold material 20 may completely laterally surround the post 220 and may (e.g., at least temporarily cover the upper end of the conductive post 220). Though the mold material 20, which may also be referred to herein as encapsulant, is shown completely covering the lateral sides and upper side of the semiconductor die 310, this need not be the case. For example, block 1150 may comprise utilizing a film assist or die seal molding technique to keep the die upper side free of mold material.

The mold material 20 may, for example, cover all exposed surfaces of the cover layer 400 formed at block 1140. For example, the mold material 20 may directly contact the cover layer 400. In an example implementation, the cover layer 400 may also directly contact any or all of the upper side of the interposer 100, the conductive post 220, the underfill 340, and/or the semiconductor die 310. For example, the cover layer 400 may completely isolate the other components of the example assembly 200E from direct contact with the mold material 20.

Note that the mold material 20 in the example shown is substantially thicker than the cover layer 400. For example, the mold material 20 may be more than 10 times or more than 100 times thicker than the cover layer 400.

In general, block 1150 may comprise encapsulating the assembly (or wafer), for example molding the wafer of package assemblies. Accordingly, the scope of this disclosure should not be limited by characteristics of any particular molding material, structure and/or technique.

The example method 100 may, at block 1160, comprise thinning the encapsulant formed at block 1150. Block 1160 may comprise thinning the encapsulant in any of a variety of manners, non-limiting examples of which are provided herein. For example, block 1160 may comprise thinning the encapsulant by mechanical grinding or cutting, laser removal or other directed energy removal process, chemical etching or other chemical removal process, any combination thereof, etc.

In an example implementation, block 1160 comprises grinding the mold material (or encapsulant) formed at block 1150. Block 1160 may, for example, comprise mechanically grinding (e.g., utilizing a diamond grinder, etc.) the mold material to thin the mold material. Such thinning may, for example, leave the die and/or interconnection structures over molded, or such thinning may expose one or more die and/or one or more interconnection structures (e.g., one or more conductive posts).

Block 1160 may, for example, comprise grinding other components in addition to the mold material. For example, block 1160 may comprise grinding the top ends of the conductive posts formed at block 1120, for example including grinding off a cover layer 400 formed on the upper ends of the conductive posts. Such grinding may, for example, result in a flat planar surface at the top side of the ground assembly.

Note that block 1160 may be skipped in an example implementation in which the encapsulant was originally formed to the desired thickness. In such an example implementation, block 1160 may for example comprise stripping the cover layer 400 from the ends of the conductive posts if necessary.

Figure 2F:
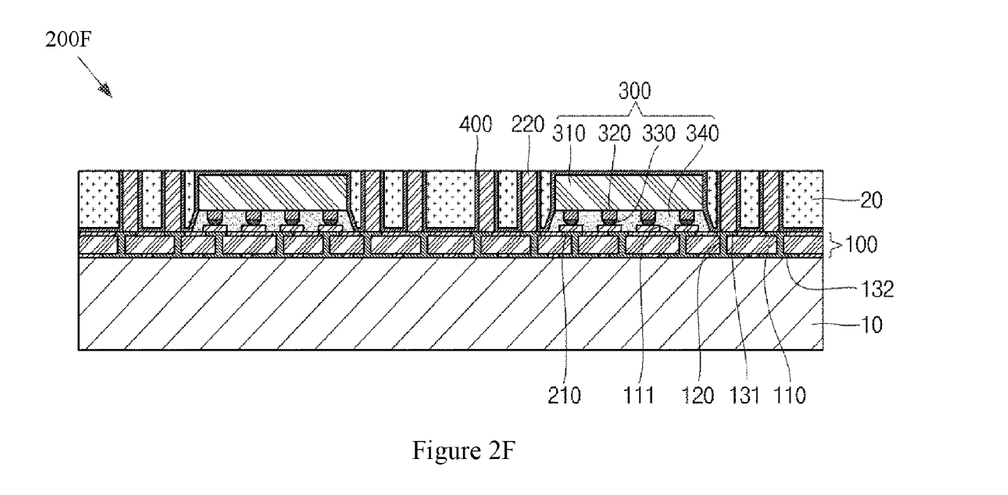

FIG. 2F provides an example illustration of various aspects of block 1160, for example the mold grinding aspects. The assembly 200F is illustrated with the mold material 20 (e.g., relative to the mold material 20 illustrated at FIG. 200E) thinned to reveal an upper end surface of the conductive post 220. Note that in this example implementation, the cover layer 400 formed on the upper end of the conductive post 220 at block 1140 is removed during the grinding (e.g., mechanically removed, etc.). A portion of the conductive post 220 may also be ground to make the conductive post 220 and/or the mold material 20 a desired height (or thickness). In an example scenario, block 1160 also removes the mold material 20 above the upper side of the semiconductor die 310, for example exposing the conductive layer 400 formed above the die 310. For example, block 1160 might be performed until the cover layer 400 above the semiconductor die 310 is reached.

In the example assembly 200F shown at FIG. 2F, after or during the mold material removal, the cover layer 400 is removed from the upper end of the conductive post 220 but remains covering the lateral side(s) of the conductive post 220. The cover layer 400 covers the lateral sides of the semiconductor die 310 and the underfill 340, and also continues to cover the upper side of the semiconductor die 310. In the example shown, the mold material 20 has been removed to an extent that exposes the cover layer 400 from the upper side of the mold material 20 (e.g., the portion of the cover layer 400 above the semiconductor die 310, a portion of the cover layer 400 on the lateral side of the conductive post 220, etc.). Note that in another example implementation, some mold material 20 may be left to cover the upper side of the die 310 in addition to the cover layer 400. In the example shown, the upper end of the conductive post 220 is higher (e.g., from the interposer 100) than the upper side of the semiconductor die 310 by the thickness of the cover layer 400 above the die 310. Also note that the cover layer 400 extends up the lateral side of the conductive post 220 to a height greater than the height of the semiconductor die 310. For example, the cover layer 400 extends up the lateral side of the conductive post 220 to a height equal to or greater than the height of the upper side of the cover layer 400 above the semiconductor die 310.

In general, block 1160 may comprise thinning the encapsulant formed at block 1150. Accordingly, the scope of this disclosure should not be limited by characteristics of any particular manner of thinning an encapsulant (or mold material).

The example method 100 may, at block 1170, comprise removing the wafer 10 (or support structure). Block 1170 may comprise removing the wafer 10 in any of a variety of manners, non-limiting examples of which are provided herein. For example, block 1170 may comprise debonding (or de-attaching) the wafer 10 (or support structure) that was provided at block 1110. Block 1170 may comprise performing such debonding in any of a variety of manners, non-limiting aspects of which are provided herein.

For example, in an example scenario in which the interposer 100 is adhesively attached to the wafer 10, the adhesive may be released (e.g., using heat and/or force). Also for example, chemical release agents may be utilized. In another example scenario in which the wafer support is attached utilizing a vacuum force, the vacuum force may be removed. Note that in a scenario involving adhesives or other substances to aid in the wafer support attachment, block 1170 may comprise cleaning residue from the interposer 100 and/or from the wafer support 10 after the debonding.

In another example scenario in which the interposer 100 is constructed directly on the wafer 10, the wafer 10 may for example be removed by mechanical and/or chemical techniques. For example, block 1170 may comprise mechanically grinding the wafer 10 and may also utilize chemical etching to remove at least some of the wafer 10. For example, block 1170 may comprise performing chemical mechanical planarization (CMP) (or polishing).

Figure 2G:
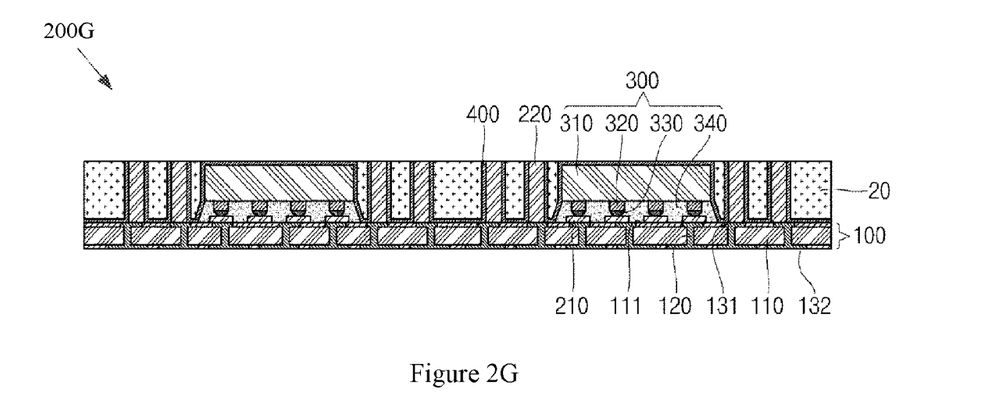

FIGS. 2F and 2G provide example illustrations 200F and 200G of various aspects of block 1170. For example, the wafer 10 illustrated in FIG. 2F is removed in FIG. 2G. The lower circuit pattern 132 is thus exposed during the wafer (or support) removal process for electrical and/or mechanical connection with interconnection structures as discussed herein.

In general, block 1170 may comprise removing the wafer (or support structure). Accordingly, the scope of this disclosure should not be limited by characteristics of any particular type of wafer support or by any particular manner of removing a wafer support.

The example method 100 may, at block 1180, comprise forming interconnection structures. For example block 1180 may comprise forming interconnection structures (e.g., package interconnection structures) on the lower surface (or side) of the interposer (e.g., the lower circuit pattern 132) exposed by the removal of the support wafer at block 1170. Block 1180 may comprise forming the interconnection structures in any of a variety of manners, non-limiting examples of which are provided herein.

Block 1180 may, for example, comprise forming an underbump metal (UBM) on portions of the lower circuit pattern 132 exposed by removal of the support wafer 10. For example, pads of the lower circuit pattern 132 may be exposed through respective apertures in a dielectric layer. Block 1180 may, for example, comprise forming under bump metallization on exposed portion of the lower circuit pattern 132. Non-limiting examples of such UBM formation and/or the forming of interconnection structures are provided herein, for example with regard to block 1107. Note that such under bump metallization need not be performed.

Block 1180 may then, for example, comprise attaching conductive bumps or balls or pillars or other structures to the under bump metal. Other interconnection structures may be utilized as well, examples of which are provided herein (e.g., conductive posts or pillars, solder balls, solder bumps, etc.).

Figure 2H:
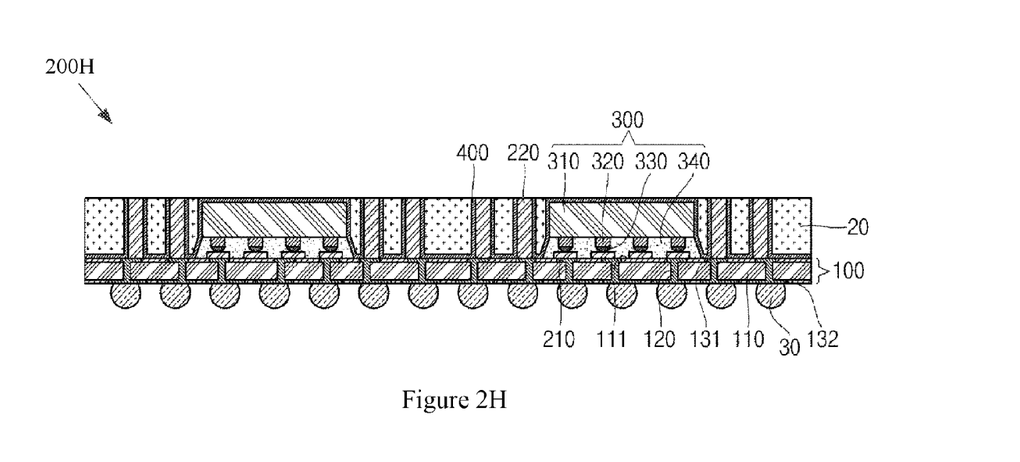
Figure 2I:
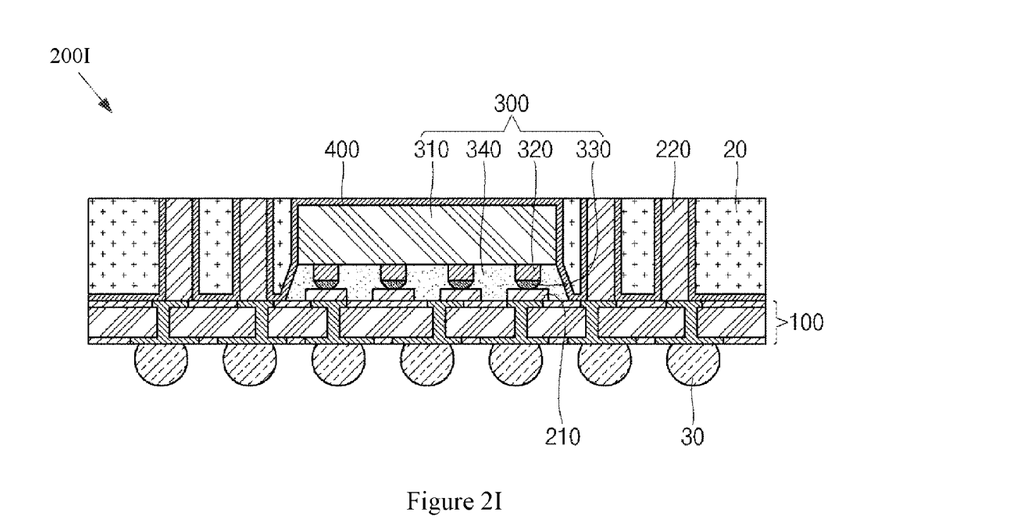

FIG. 2H provides an example illustration 200H of various aspects of block 1180, for example interconnection structure forming aspects. For example, interconnection structures 30 (e.g., conductive balls or bumps, conductive posts or pillars, etc.) are attached to the lower circuit pattern 132 and/or UBM formed thereon. Note that although the interconnection structures 30 are illustrated as being smaller than the interconnection structures 320, this disclosure is not so limited. For example, the interconnection structures 30 may be the same size as the interconnection structures 320 or larger than the interconnection structures 320. Additionally, the interconnection structures 30 may be the same type of interconnection structure as the interconnection structures 320 or may be a different type. Also for example, the interconnection structures 30 may be formed utilizing the same type of process as the interconnection structures 320 or may be formed utilizing a different type of process (e.g., plating versus ball-dropping, solder-capping versus solder ball attaching, etc.)

Though the interposer 100 and interconnection structures 30 are generally illustrated in FIG. 2H in a fan-out configuration (e.g., extending outside of the footprint of the die 310), they may alternatively and/or also be formed in a fan-in configuration, for example in which the interconnection structures 30 do not generally extend outside the footprint of the die 310.

In general, block 1180 may comprise forming interconnection structures. Accordingly, the scope of this disclosure should not be limited by characteristics of any particular interconnection structures or by any particular manner of forming interconnection structures.

The example method 100 may, at block 1190, comprise singulating individual semiconductor packages from the wafer assembly. Such singulating may also, for example, be referred to as dicing (e.g., from dicing the interposer 100, or a wafer or panel thereof). Block 1190 may comprise singulating the wafer in any of a variety of manners, non-limiting examples of which are provided herein.

The discussion herein has generally focused on processing and/or structures of a single interposer and/or semiconductor package of a wafer (or panel) of packages. Such focus on a single interposer and/or semiconductor package of a wafer is for illustrative clarity only. It should be understood that all of the process steps discussed herein may be performed on an entire wafer. For example, each of the illustrations provided at FIGS. 2A-2I and other figures herein may be replicated tens or hundreds of times on a single wafer. For example, until dicing, there might be no separation between one of the illustrated assemblies and a neighboring assembly of a wafer of such assemblies.

Block 1190 may, for example, comprise singulating (e.g., mechanical punch-cutting, mechanical saw-cutting, laser cutting, soft beam cutting, plasma cutting, etc.) the individual packages from the wafer. The end result of such singulating may, for example, be the package 2001 shown in FIG. 2I. For example, the singulating may form side surfaces of the package 2001 comprising coplanar side surfaces of a plurality of components of the package 2001. For example, side surfaces of any or all of the mold material 20, the cover layer 400, the interposer 100 (or any or all of the layers thereof), etc., may be coplanar at the lateral side of the package 2001.

In general, block 1190 may comprise singulating the wafer, for example from the wafer assembly. Accordingly, the scope of this disclosure should not be limited by characteristics of any particular manner of singulating.

As discussed herein in the discussion of FIGS. 1 and 2, block 1160 may comprise thinning the encapsulant, for example to expose the top ends of the conductive posts, to expose a cover layer on top of the die, to expose a top surface of the die, etc., but such thinning may be skipped or only partially performed. In an example implementation, the conductive posts may be exposed from the encapsulant by removing respective portions of the encapsulant (e.g., by ablation, etc.). Examples of such method and/or structural aspects, along with other method and/or structure aspects will now be discussed with reference to FIGS. 3 and 4A-4H.

Figure 3:
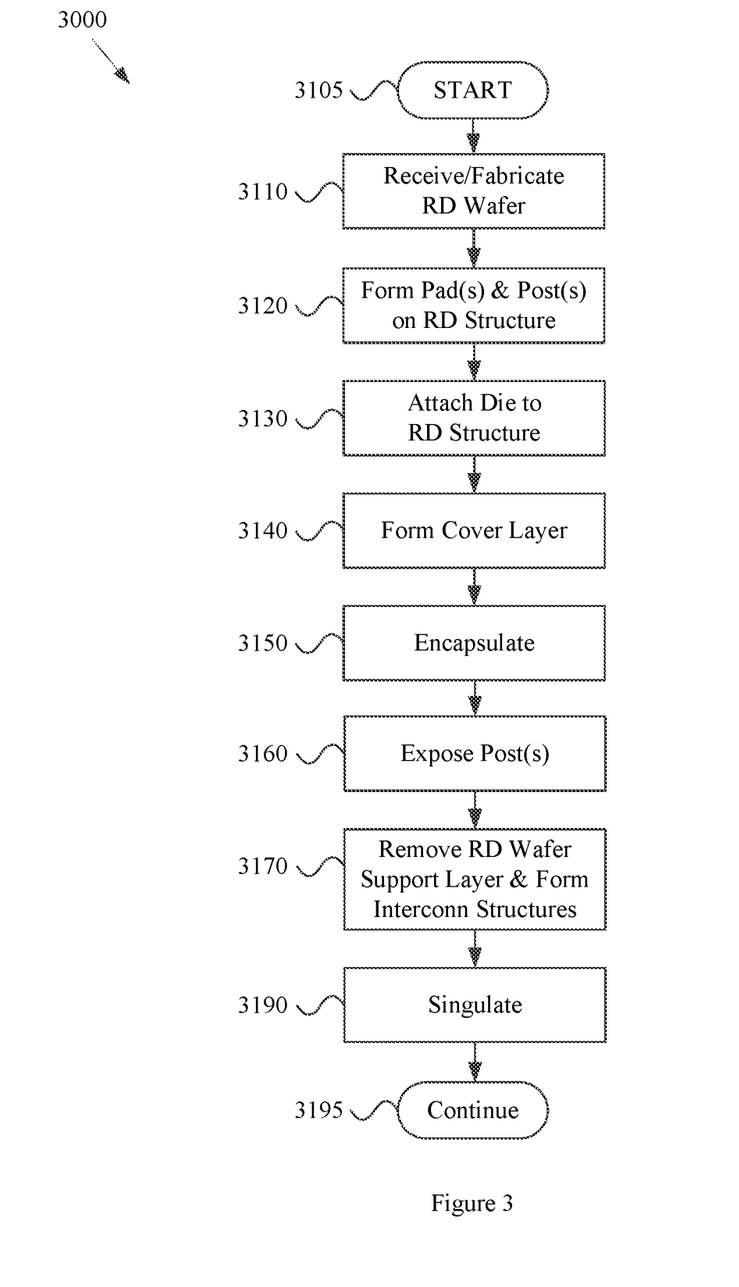
FIG. 3 shows a flow diagram of an example method of making a semiconductor package, in accordance with various aspects of the present disclosure.

The example method 3000 may, at block 3107, comprise preparing a logic wafer for processing (e.g., for packaging). Block 3107 may, for example, share any or all characteristics with block 1107 of the example method 1000 of FIG. 1. Block 3107 may, for example, comprise preparing the logic wafer for processing in any of a variety of manners.

Figure 4A:
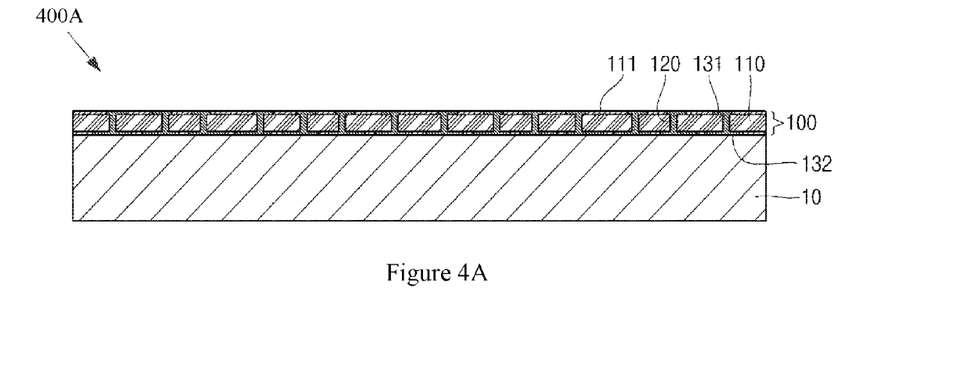
FIGS. 4A-4H show cross-sectional views illustrating an example semiconductor package and an example method of making a semiconductor package, in accordance with various aspects of the present disclosure.

The example method 3000 may, at block 3110, comprise preparing an interposer wafer (or panel). Block 3110 may, for example, share any or all characteristics with block 1110 of the example method 1000 of FIG. 1. Block 3110 may, for example, comprise preparing an interposer wafer in any of a variety of manners. FIG. 4A provides an example illustration 400A of various aspects of block 3110. The example illustration 400A may, for example, share any or all characteristics with the example illustration 200A of FIG. 2A.

Figure 4B:
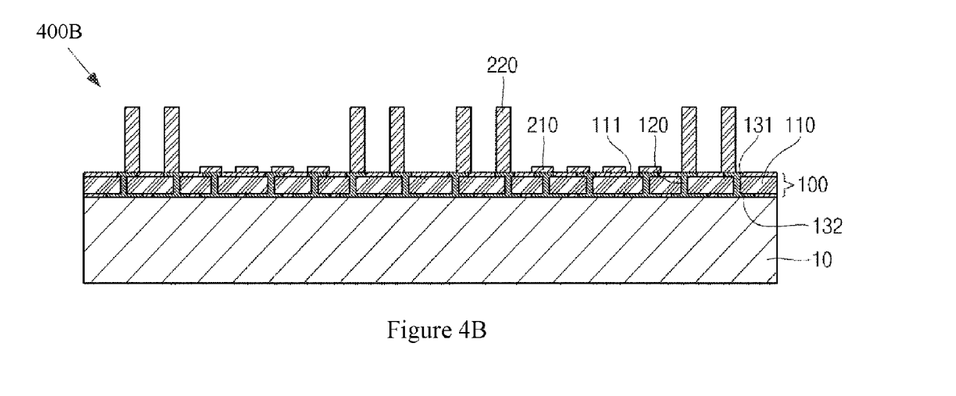

The example method 3000 may, at block 3120, comprise forming one or more conductive pads and/or conductive posts (or pillars) on the interposer. Block 3120 may, for example, share any or all characteristics with block 1120 of the example method 1000 of FIG. 1. Block 3120 may, for example, comprise preparing an interposer wafer in any of a variety of manners. FIG. 4B provides an example illustration 400B of various aspects of block 3120. The example illustration 400B may, for example, share any or all characteristics with the example illustration 200B of FIG. 2B.

Figure 4C:
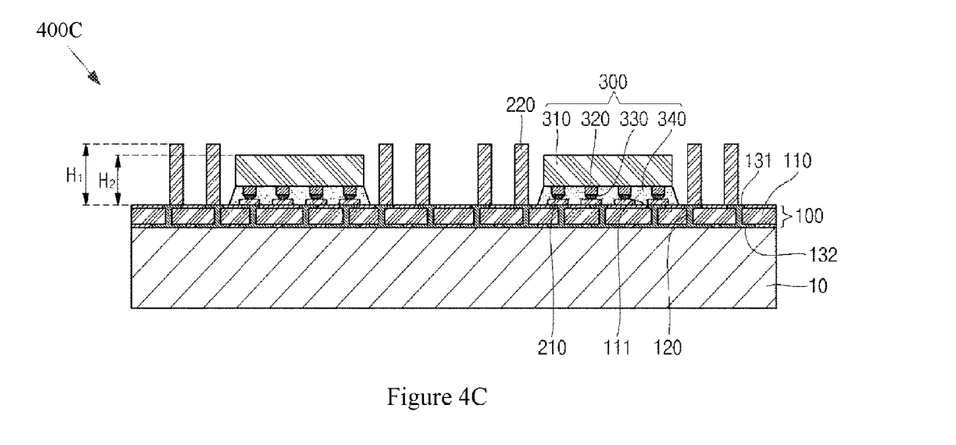

The example method 3000 may, at block 3130, comprise attaching one or more semiconductor die to the interposer (or RD structure). Block 3130 may, for example, share any or all characteristics with block 1130 of the example method 1000 of FIG. 1. Block 3130 may, for example, comprise attaching one or more semiconductor die in any of a variety of manners. FIG. 4C provides an example illustration 400C of various aspects of block 3130. The example illustration 400C may, for example, share any or all characteristics with the example illustration 200C of FIG. 2C.

Figure 4D:
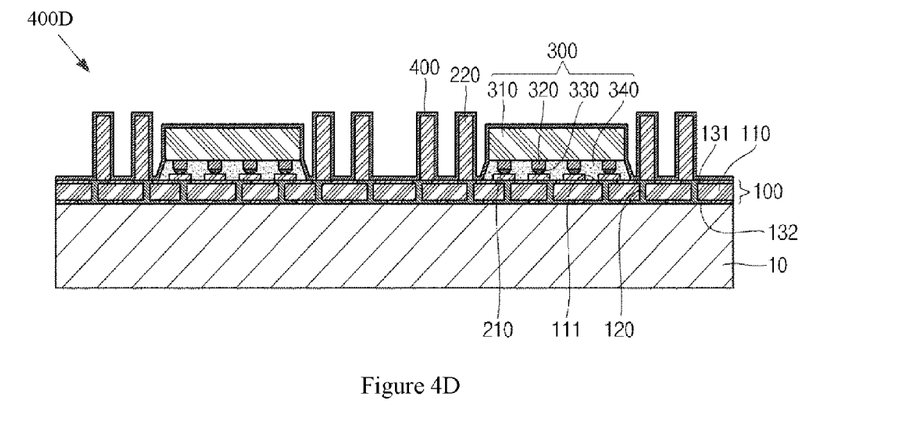

The example method 3000 may, at block 3140, comprise forming a cover layer on the interposer 100, conductive post 220, and/or semiconductor module 300 (or portions thereof). Block 3140 may, for example, share any or all characteristics with block 1140 of the example method 1000 of FIG. 1. Block 3140 may, for example, comprise forming a cover layer in any of a variety of manners. FIG. 4D provides an example illustration 400D of various aspects of block 3140.

The example illustration 400D may, for example, share any or all characteristics with the example illustration 200D of FIG. 2D.

Figure 4E:
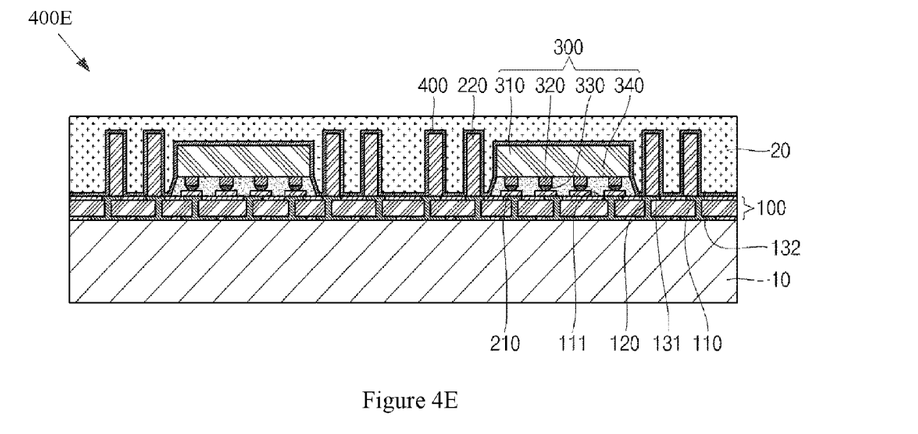

The example method 3000 may, at block 3150, comprise encapsulating the assembly (or wafer). Block 3140 may, for example, share any or all characteristics with block 1150 of the example method 1000 of FIG. 1. Block 3150 may, for example, comprise encapsulating the assembly (or wafer) in any of a variety of manners. FIG. 4E provides an example illustration 400E of various aspects of block 3150. The example illustration 400E may, for example, share any or all characteristics with the example illustration 200E of FIG. 2E.

The example method 3000 may, at block 3160, comprise exposing the conductive posts (e.g., as formed at block 3120). Block 3160 may, for example, share any or all characteristics with block 1160 of the example method 1000 of FIG. 1. Block 3160 may expose the conductive posts in any of a variety of manners, non-limiting examples of which are provided herein.

For example, block 3160 may comprise ablating (or removing) mold material above the conductive posts to expose at least an upper end surface thereof. Block 3160 may, for example, comprise mechanically ablating (or drilling), laser ablating (or drilling), chemically etching (or drilling), soft beam ablating (or drilling), etc. Block 3160 may also, for example, comprise removing the cover layer from the upper end of the conductive post.

Figure 4F:
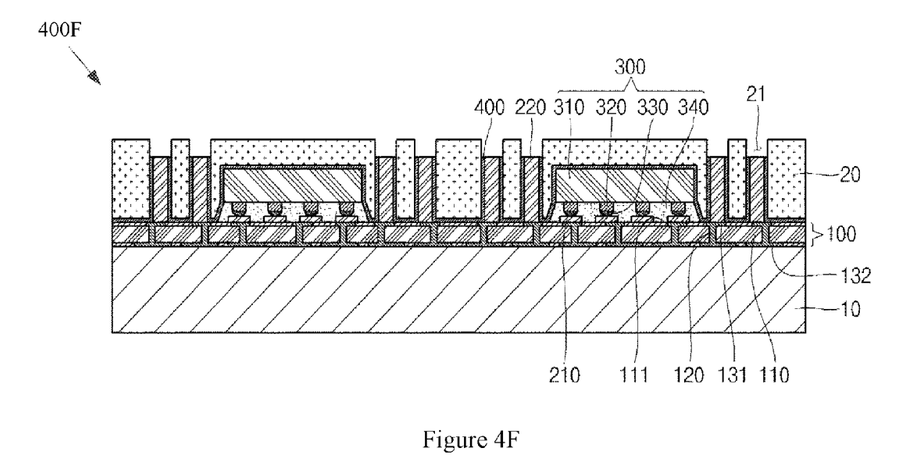

FIG. 4F provides an example illustration 400F of various aspects of block 3160, for example conductive post exposing aspects. The example illustration 400E may, for example, share any or all characteristics with the example illustration 200E of FIG. 2E.

As discussed herein, for example in the discussion of FIGS. 1 and 2, the upper side of the semiconductor die 310 may be covered with both the cover layer 400 and the mold material 20. In the example implementation illustrated in FIG. 4F, the upper end of the conductive post 220 is recessed below the upper side of the mold material 20. The mold material 20 above the upper end of the conductive posts 220 has been removed (e.g., along with the cover layer 400 on such upper end formed at block 3140), thus providing for a conductive connection to the upper end of the conductive post 220. For example, another semiconductor package, another interposer, additional redistribution structure layers, any of a variety of different types of interconnection structures, etc., may be conductively connected to the exposed upper end of the conductive post 220.

The conductive post 220 is shown taller than the semiconductor die 310. For example, the upper end of the conductive post 220 is higher than the upper side of the semiconductor die 310. This, however, need not be the case. For example, the upper end of the conductive post 220 may be at a level below the upper side of the semiconductor die 310. Also for example, the upper end of the conductive post 220 may be at a height between heights of the upper side and lower side of the semiconductor die 310. In an example implementation, an aperture formed in the mold material 20 to expose the upper end of the conductive post 220 may extend to a depth below the upper side of the semiconductor die.

Though the aperture formed in the mold material 20 to expose the conductive post 220 is shown to be a same width as the conductive post 220 (e.g., including the thickness of the cover layer 400 on the lateral side of the conductive post 220), this need not be the case. For example, the aperture may be wider than the conductive post 220 and/or wider than the conductive post 220 combined with the thickness of the cover layer 400. Additionally for example, the aperture might be only as wide as (or narrower than) the top end of the conductive post 220, for example not exposing the cover layer 400 on the lateral side of the conductive post 220. Also, though the aperture is generally illustrated with vertical side walls, this need not be the case. For example, the side walls of the aperture may be sloped. For example, the aperture may be wider at the upper end (e.g., at the upper side of the mold material 20) than at the lower end (e.g., at or near the upper end of the conductive post 220).

Additionally, though the cover layer 400 is shown covering the entire lateral side of the conductive post 220 in FIG. 4F, this need not be the case. For example, at least an upper portion of the lateral side of the conductive post 220 may be exposed from the cover layer 400 (e.g., along with the upper end of the conductive post 220). In an example implementation, the same process utilized to expose the upper end of the conductive post 220 (or a different process) may remove a portion of the cover layer 400 on an upper portion of the lateral side of the conductive post 220.

In general, block 3160 may comprise exposing the conductive posts. Accordingly, the scope of this disclosure should not be limited by characteristics of any particular manner of performing such exposing.

Figure 4G:
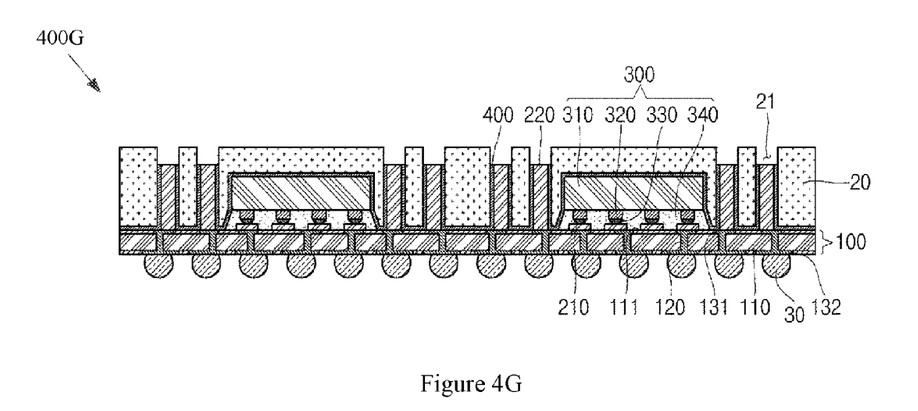

The example method 3000 may, at block 3170, comprise removing the wafer 10 (or support structure) and forming interconnection structures. Block 3170 may, for example, share any or all characteristics with blocks 1170 and 1180 of the example method 1000 of FIG. 1. Block 3170 may comprise removing the wafer 10 and forming interconnection structures in any of a variety of manners. FIGS. 4F and 4G provide example illustrations 400F and 400G of various aspects of block 3170. For example, the wafer 10 shown in FIG. 4F is not present in FIG. 4G. Additionally, interconnection structures 30 are formed on the lower side of the interposer 100 in FIG. 4G, for example attached to the lower circuit pattern 132.

Figure 4H:
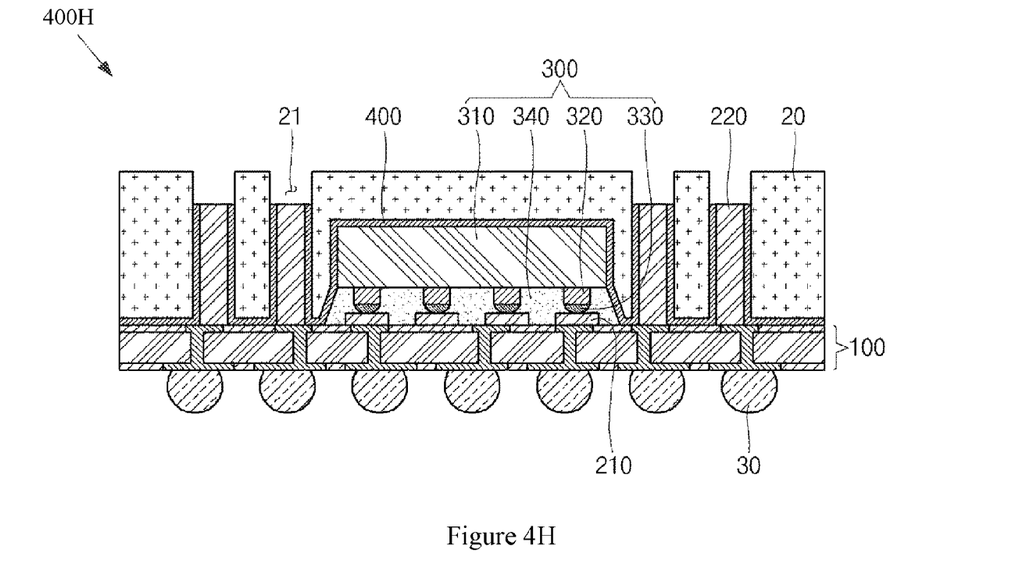

The example method 3000 may, at block 3190, comprise singulating individual semiconductor packages from the wafer assembly. Block 3190 may, for example, share any or all characteristics with block 1190 of the example method 1000 of FIG. 1. Block 3190 may, for example, comprise singulating the semiconductor packages in any of a variety of manners. FIG. 4H provides an example package 400H that may result from such singulating.

The discussion herein included numerous illustrative figures that showed various portions of a semiconductor package assembly and method of manufacturing thereof. For illustrative clarity, such figures did not show all aspects of each example assembly. Any of the example assemblies and/or methods provided herein may share any or all characteristics with any or all other assemblies and/or methods provided herein. For example and without limitation, any of the example assemblies and/or methods shown and discussed with regard to FIGS. 1 and 2, or portions thereof, may be incorporated into any of the example assemblies and/or methods discussed with regard to FIGS. 3 and 4. Conversely, any of the assemblies and/or methods shown and discussed with regard to FIGS. 3 and 4 may incorporated into the assemblies and/or methods shown and discussed with regard to FIGS. 1 and 2.

In summary, various aspects of this disclosure provide a semiconductor package and a method of manufacturing a semiconductor package. As non-limiting examples, various aspects of this disclosure provide various semiconductor packages, and methods of making thereof, that comprise a cover layer that enhances reliability of the semiconductor packages. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor package comprising:
a redistribution (RD) structure comprising an upper RD side, a lower RD side, and a lateral RD side that extends between the upper RD side and the lower RD side;
a conductive pad on the upper RD side;
a conductive post on the upper RD side, the conductive post comprising an upper post end, a lower post end, and a lateral post side that extends between the upper post end and the lower post end;
a semiconductor die on the upper RD side and electrically connected to the conductive pad;
a cover layer covering at least a portion of the semiconductor die and at least a portion of the conductive post; and
an encapsulating material that covers at least a portion of the cover layer, at least a portion of the semiconductor die, and at least a portion of the conductive post.

2. The semiconductor package of claim 1, wherein the cover layer is a continuous layer of dielectric material.

3. The semiconductor package of claim 1, wherein the cover layer extends up the lateral post side higher than a height of an upper side of the semiconductor die and covers an upper side of the semiconductor die.

4. The semiconductor package of claim 1, wherein the cover layer has a generally uniform thickness.

5. The semiconductor package of claim 1, wherein a lateral side of the cover layer, a lateral side of the RD structure, and a lateral side of the encapsulating material are coplanar.

6. The semiconductor package of claim 1, wherein the cover layer directly contacts the conductive post and the semiconductor die.

7. The semiconductor package of claim 1, wherein the cover layer extends laterally over the RD structure from the semiconductor die to the conductive post.

8. The semiconductor package of claim 1, wherein the cover layer is between and keeps separate the encapsulating material and the RD structure.

9. The semiconductor package of claim 1, wherein a continuous portion of the cover layer covers the lateral post side and extends to a lateral side of the semiconductor package.

10. The semiconductor package of claim 1, comprising an underfill material between the semiconductor die and the upper RD side, and wherein the cover layer covers a side surface of the underfill material.

11. A semiconductor package comprising:
a redistribution (RD) structure comprising an upper RD side, a lower RD side, and a lateral RD side that extends between the upper RD side and the lower RD side;
a conductive pad on the upper RD side;
a conductive post on the upper RD side, the conductive post comprising an upper post end, a lower post end, and a lateral post side that extends between the upper post end and the lower post end;
a semiconductor die on the upper RD side and electrically connected to the conductive pad;
a cover layer covering at least a portion of the conductive post and at least a portion of the RD structure; and
an encapsulating material that covers at least a portion of the cover layer, at least a portion of the semiconductor die, and at least a portion of the conductive post.

12. The semiconductor package of claim 11, wherein the cover layer is a continuous layer of dielectric material.

13. The semiconductor package of claim 11, wherein the cover layer extends laterally over the RD structure from the conductive post to a second conductive post.

14. The semiconductor package of claim 11, wherein a continuous portion of the cover layer covers the lateral post side and extends to a lateral side of the semiconductor package.

15. The semiconductor package of claim 11, comprising an underfill material between the semiconductor die and the upper RD side, and wherein the cover layer covers a side surface of the underfill material.

16. A semiconductor package comprising:
a redistribution (RD) structure comprising an upper RD side, a lower RD side, and a lateral RD side that extends between the upper RD side and the lower RD side;
a conductive pad on the upper RD side;
a conductive post on the upper RD side, the conductive post comprising an upper post end, a lower post end, and a lateral post side that extends between the upper post end and the lower post end;
a semiconductor die on the upper RD side and electrically connected to the conductive pad;
a cover layer covering at least a portion of the semiconductor die and at least a portion of the RD structure; and
an encapsulating material that covers at least a portion of the cover layer, at least a portion of the semiconductor die, and at least a portion of the conductive post.

17. The semiconductor package of claim 16, wherein the cover layer is a continuous layer of dielectric material.

18. The semiconductor package of claim 16, wherein the cover layer extends laterally over the RD structure from the semiconductor die toward the conductive post.

19. The semiconductor package of claim 16, wherein a continuous portion of the cover layer covers a lateral side of the semiconductor die and extends to a lateral side of the semiconductor package.

20. The semiconductor package of claim 16, wherein the cover layer covers an upper side and a lateral side of the semiconductor die.

* * * * *